United States Patent

Yamagishi et al.

[11] Patent Number: 5,815,035
[45] Date of Patent: Sep. 29, 1998

[54] DEMODULATING CIRCUIT, DEMODULATING APPARATUS, DEMODULATING METHOD, AND MODULATING/DEMODULATING SYSTEM OF ACOUSTIC SIGNALS

[75] Inventors: Shinichi Yamagishi; Noritaka Egami, both of Hyogo, Japan

[73] Assignee: Mitsubishi Denki Kabushiki Kaisha, Tokyo, Japan

[21] Appl. No.: 816,376

[22] Filed: Mar. 13, 1997

[30] Foreign Application Priority Data

Sep. 26, 1996 [JP] Japan .................................. 8-254466

[51] Int. Cl.$^6$ ............................ H03D 1/00; H04L 27/06; G01V 3/00
[52] U.S. Cl. .................... 329/311; 329/361; 340/854.4; 375/320
[58] Field of Search ..................................... 329/304–310, 329/311–314, 361–362; 327/77–78, 91, 93; 375/320–321, 329–333; 340/854.4, 854.5

[56] References Cited

U.S. PATENT DOCUMENTS

| | | | |
|---|---|---|---|
| 4,857,859 | 8/1989 | Asahi et al. | 329/363 |
| 5,448,227 | 9/1995 | Orban et al. | 340/854.4 |
| 5,592,438 | 1/1997 | Rorden et al. | 340/854.4 X |
| 5,675,325 | 10/1997 | Taniguchi et al. | 340/854.4 |

FOREIGN PATENT DOCUMENTS 62-2113  1/1987  Japan .

OTHER PUBLICATIONS

Douglas S. Drumheller, "Acoustical properties of drill strings," *The Journal of the Acoustical Society of America*, vol. 85, No. 3, Mar. 1989, cover page, and pp. 1048–1064.

*Primary Examiner*—David Mis
*Attorney, Agent, or Firm*—Burns, Doane, Swecker & Mathis, LLP

[57] ABSTRACT

A demodulating method wherein the signal can be demodulated accurately even if the S/N ratio is lower by calculating an amplitude peak value by a specific formula from two values of an amplitude of an acoustic signal corresponding to a phase difference of 90 degrees at a carrier frequency transmitted by an acoustic signal transmitter, setting a threshold level preliminarily for the amplitude peak value, and demodulating the amplitude peak value by binarization on the basis of the threshold level, and a demodulating circuit and a demodulating apparatus used in the execution thereof. It is further possible to follow up automatically even when the acoustic characteristics change by automatically calculating the average of peak values of output of the vibration sensor in a state not transmitting the acoustic signal, automatically setting the signal level by a formula predetermined on the basis of the obtained average, and automatically calculating the threshold level from the average of the peak values and the signal level.

13 Claims, 9 Drawing Sheets

FIG. 6A ORIGINAL WAVEFORM

FIG. 6B PEAK VALUE $$P = \sqrt{a^2 + b^2}$$
$$\simeq a + 0.42(b^2/a)$$

FIG. 6C PEAK VALUE HOLDING

FIG. 6D DEMODULATED WAVEFORM

DEMODULATING CIRCUIT, DEMODULATING APPARATUS, DEMODULATING METHOD, AND MODULATING/DEMODULATING SYSTEM OF ACOUSTIC SIGNALS

BACKGROUND OF THE INVENTION

The present invention relates to a demodulating method of acoustic signal and a demodulating circuit and a demodulating apparatus for execution thereof, for transmitting underground information at a leading end of an excavation drill, for example, when excavating a petroleum or gas well, to above ground in real time as a digital signal (pulse signal) using an acoustic signal as a carrier.

Recently, to control the leading end of an excavation drill for the purpose of reducing the excavation cost and enhancing the safety, a MWD (measurement while drilling) system has been employed for transmitting the stratum information or excavation information in real time to above ground while drilling.

Such apparatus relate to an improvement of a demodulating apparatus and demodulating method in an apparatus for transmitting digital signal using acoustic signal as carrier.

Hitherto a differential phase modulating and demodulating circuit is widely used for modulating and demodulating an acoustic signal by a digital signal. For example, FIG. 1 is a block diagram showing a transmission apparatus by a conventional differential phase-shift keying (DPSK) system disclosed in "Modern Digital Communication Method" by Hiroshi Miyagawa and Takuya Koizumi (Ohm-sha, September 1981).

In the diagram, reference numeral 3 denotes a vibration sensor which is installed in a transmitting medium (specifically a drill string to which an excavation drill is connected). This transmission apparatus comprises a delay circuit 22 for receiving a signal (input signal 21) detected by the vibration sensor 3 and delaying it, a multiplier 24 for multiplying the input signal 21 and a delay output signal 23 from the delay circuit 22, and a decoder 26 for decoding an output signal 25 from the multiplier 24 to issue a decoded pulse signal 27.

Figure 1:
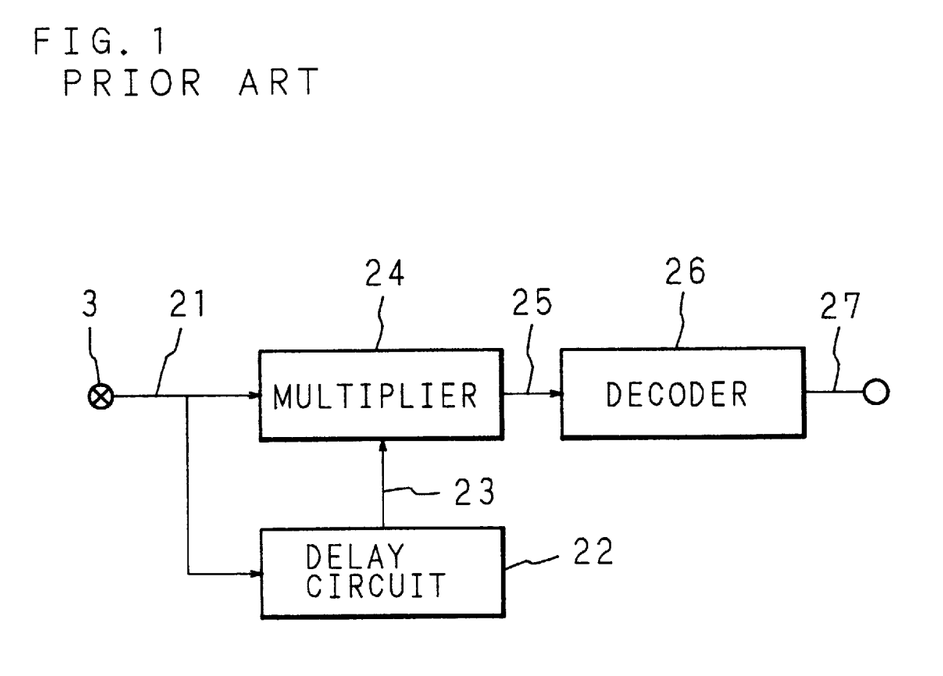
FIG. 1 is a block diagram showing a constitution of a demodulator of a conventional acoustic transmission apparatus.
Figure 2:
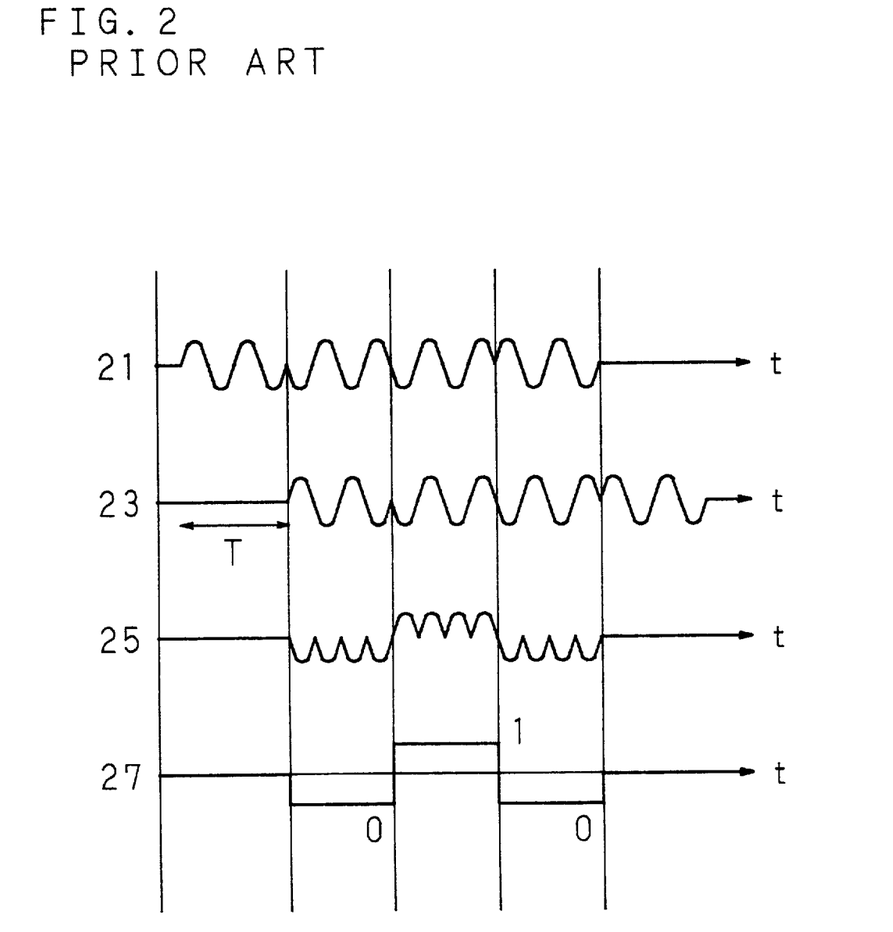
FIG. 2 is a waveform transform diagram for explaining the demodulator in FIG. 1.

FIG. 2 is a timing chart showing waveforms of parts in FIG. 1 in order to explain the operation. The axis of abscissas in FIG. 2 denotes the same time axis in each waveform diagram.

The operation is described below. An acoustic signal detected by the vibration sensor 3 has the carrier amplified selectively by a filter not shown, and enters as the input signal 21. The input signal 21 modulated by differential phase-shift keying is in a waveform as shown by 21 in FIG. 2. The waveform of the delay output signal 23 delayed by time T in the delay circuit 22 is as shown by 23 in FIG. 2. This delay output signal 23 is multiplied by the input signal 21 in the multiplier 24 to be an output signal 25, which is put into the decoder 26. Being decoded by the decoder 26, a decoded pulse signal 27 is produced.

Conventionally, the delay time T by the delay circuit 22 in differential phase-shift keying is specified at the same time as the bit period. Inside the decoder 26, the output signal 26 is integrated (that is, averaged) on the basis of the clock synchronized with the bit period T, and it is decoded by passing the result of integration through a slicer.

In a waveform 27 in FIG. 2, for example, with the slice level of the slicer at 0, it is decoded as transmission of a code of phase difference of bits of 180 degrees when the result of integration is a negative value, and a code of phase difference of bits of 0 degree when it is a positive value.

Differential phase-shift keying is to modulate the carrier by correspondence of code of 1 and 0, or 0 and 1 between the phase difference of bits of 0 degrees and 180 degrees, and therefore it can be returned to the decoded pulse signal 27 depending on whether the result of integration in the decoder 26 is positive or negative.

Herein, FIG. 2 shows an ideal waveform, and actually when the length of the drill string is long, each waveform is concealed by noise, and the S/N ratio is poor and it is hard to distinguish. It is hence hard to judge whether the average of the waveform 25 is positive or negative.

In the same drill string, if it becomes long or old as the excavation progresses, the acoustic transmission characteristic varies, and it is not always the same, which is another problem.

In the conventional acoustic transmission system, since the signal is demodulated in that manner, it is weak compared to the noise signal and, when the S/N ratio is poor, the probability of correct decoding of transmitted signal is lowered.

Besides, it is not possible to cope automatically with changes in the acoustic transmission characteristic.

BRIEF SUMMARY OF THE INVENTION

The invention has been devised to solve the above problems, and it is hence an object thereof to present a demodulating method capable of demodulating accurately even a signal of a lower S/N ratio, and a demodulating circuit and a demodulating apparatus used for the execution thereof.

According to the invention, an amplitude peak value (extreme value) is calculated by a specific formula from two values of the amplitude of acoustic signal corresponding to a phase difference of 90 degrees of pulse signal transmitted by an acoustic signal transmitter, a threshold level is predetermined for an amplitude peak value, and the amplitude peak value is demodulated as binary value according to the threshold level.

Therefore, the peak value of a waveform can be obtained by a simple constitution (or procedure), and the apparatus is simplified.

It is another object of the invention to present a demodulating method capable of following up automatically if the acoustic characteristic changes, and a demodulating circuit and a demodulating apparatus for use in execution thereof.

According to the invention, the average of peak values of output of vibration sensor is automatically determined in the state in which acoustic signal is not transmitted, and a signal level is set automatically by a predetermined formula on the basis of the obtained average of peak values, and the threshold level is automatically calculated from the average of peak values and the signal level.

Therefore, since the threshold level is set automatically, handling is easier.

This series of procedures (the procedure for automatically calculating the average of peak values, the procedure for automatically assuming the signal level by predetermined formula on the basis of the obtained average of peak values, and the procedure for automatically calculating the threshold level from the average of peak values and the signal level) is executed prior to a start of signal transmission.

Accordingly, in spite of changes in transmission environments, re-setting of threshold level is done automatically, so that handling is much easier.

The above and further objects and features of the invention will more fully be apparent from the following detailed description with accompanying drawings.

DETAILED DESCRIPTION OF THE INVENTION

Referring now to the drawings, preferred embodiments of the invention are described in detail below. In the drawings, same or corresponding parts are identified with same reference numerals and the description is simplified.

Embodiment 1

Figure 3:
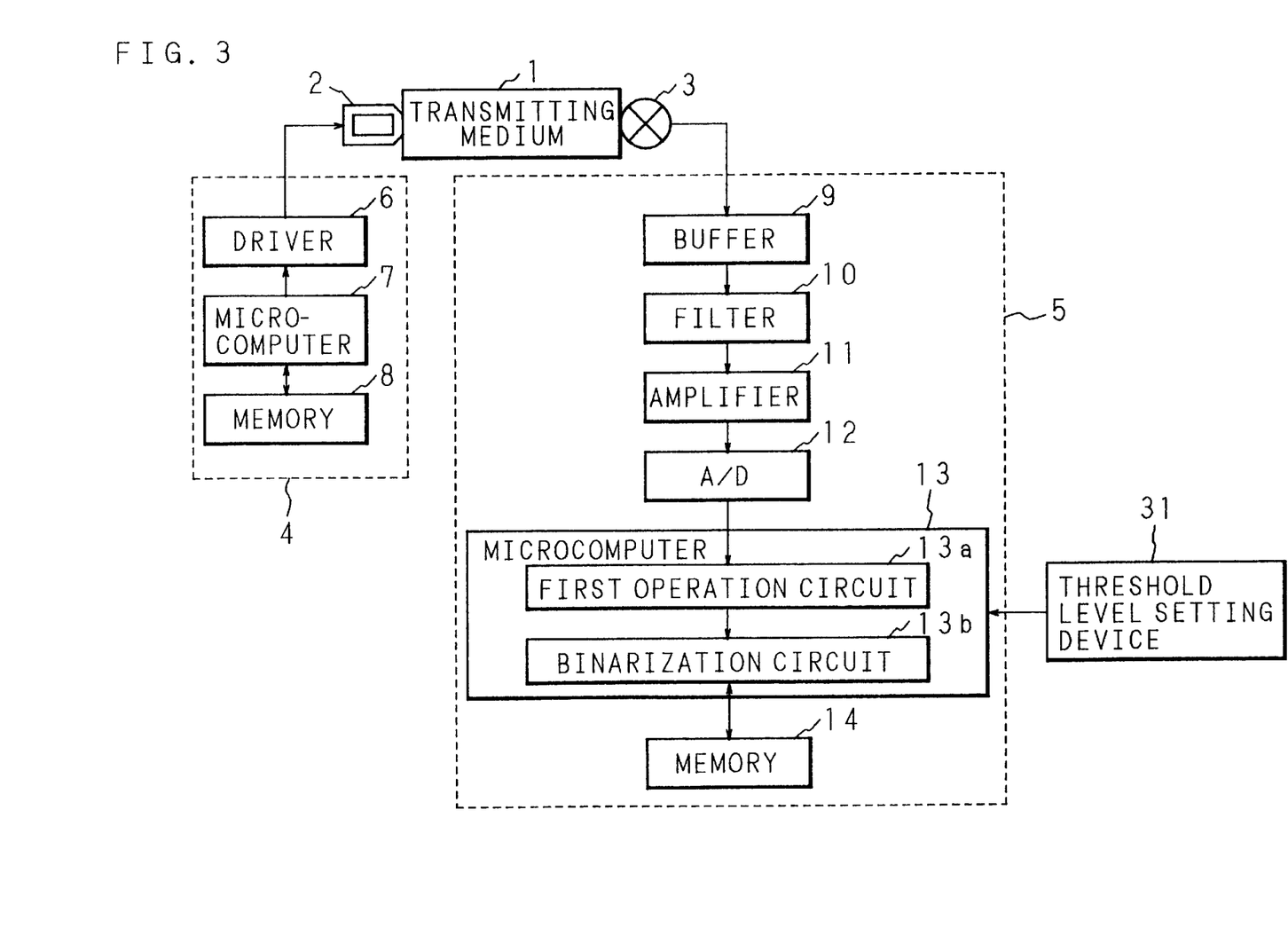
FIG. 3 is a block diagram of an acoustic transmission apparatus in embodiment 1 of the invention.

In FIG. 3, reference numeral 1 denotes a transmitting medium for transmitting sound. The demodulating apparatus of acoustic signal of the invention comprises a magnetostriction oscillator (acoustic signal transmitter) 2 for applying vibrations to the transmitting medium 1, a vibration sensor 3 for detecting vibrations of the transmitting medium 1, a driver unit 4 for driving the magnetostriction oscillator 2, and a demodulating circuit 5 for demodulating the detected vibration into data. The driver unit 4 contains a driver 6 for driving the magnetostriction oscillator 2, a microcomputer 7 for controlling the driver 6, and a memory 8 for storing the program and data of the microcomputer 7.

The demodulating circuit 5 contains a buffer 9 for receiving the signal from the vibration sensor 3 and issuing a high input impedance and a low output impedance, a narrow band frequency filter 10, an amplifier 11 for amplifying a feeble signal, an A/D converter 12 for converting an analog signal into a digital signal, a microcomputer 13 for running a program for modulating detected vibration into data, and a memory 14 for storing the program and data for the microcomputer 13. The microcomputer 13 possesses a first operation circuit 13a for calculating the amplitude peak value at a time interval corresponding to a phase difference of 90 degrees of the signal delivered from the A/D converter 12, a binarization circuit 13b for demodulating into a pulse signal, setting the amplitude peak value exceeding a threshold level at a signal 1, and amplitude peak value not exceeding the threshold level at a signal 0. Moreover, a threshold setting device 31 having manually setting means 31a is connected to the microcomputer 13.

Figure 4:
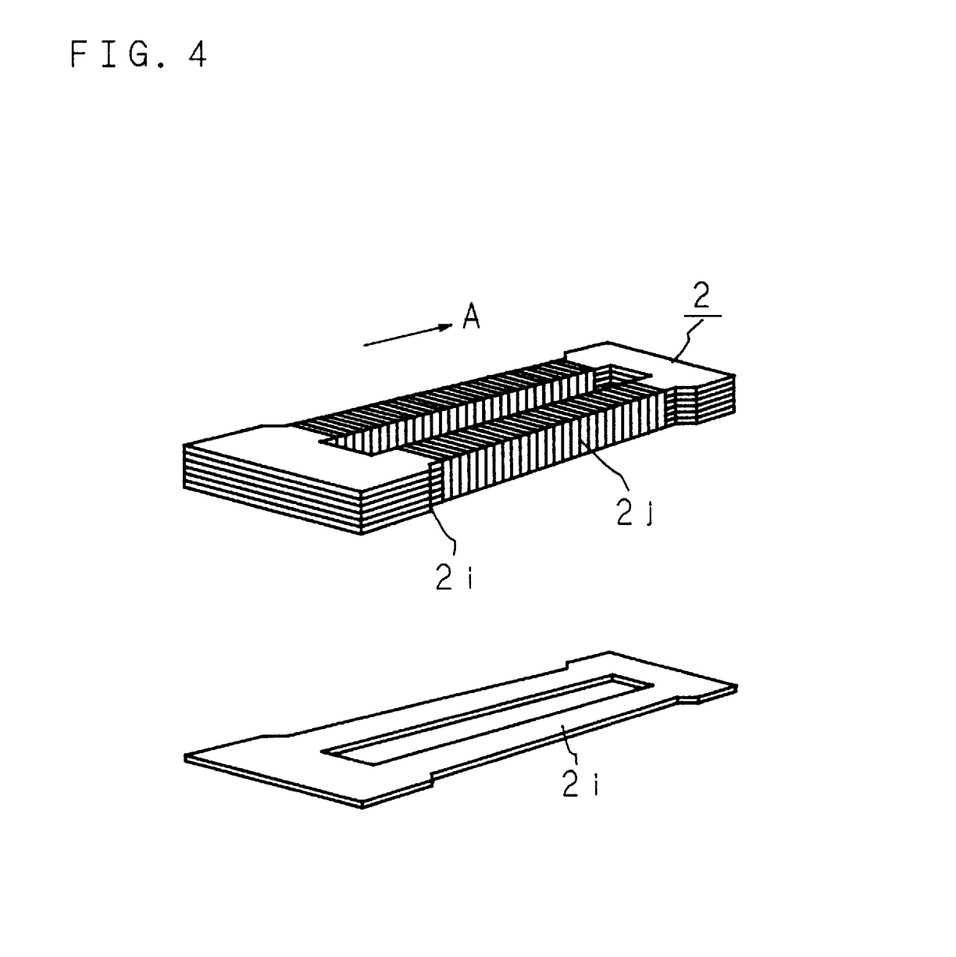
FIG. 4 is a diagram showing an example of structure of a magnetostriction oscillator in FIG. 3.

In the invention, the type of the oscillator 2 is not particularly important, but prior to explanation of operation in FIG. 3, the magnetostriction oscillator 2 used generally is explained in FIG. 4. For example, Ni and Co—Fe alloy and the like are magnetostrictive materials, and when a wire is wound around a magnetostrictive material and an electric current is passed to create a magnetic field, it is distorted in the field system direction (contracted in the case of Ni, and expanded in the case of Co—Fe alloy).

In FIG. 4, reference numeral 2i denotes a thin slice of magnetostrictive material with an open hole, and the magnetostriction oscillator 2 is composed by laminating multiple layers of magnetostrictive material 2i and winding with a wire 2j. Layers of magnetostrictive material 2i are electrically insulated by insulators. This is intended to minimize the eddy current loss because an alternating current flows in the wire 2j.

When an electric current is passed in the wire 2j of the magnetostriction oscillator 2, the magnetostriction oscillator 2 is magnetized, and is distorted in the field system direction, and is restored when the current is set to 0. By turning on and off the current, the magnetostriction oscillator 2 can be vibrated.

An outline of operation is described in FIG. 3.

In the driver unit 4, the driver 6 is driven by a command from the microcomputer 7, and a pulse current is passed in the magnetostriction oscillator 2 to generate vibration. This vibration is modulated by differential phase by the digital signal (pulse signal) to be transmitted as mentioned above.

The vibration is transmitted inside the transmitting medium 1 as sound wave, and the sound wave is detected by the vibration sensor 3. It is buffered by the buffer 9 in the demodulating circuit 5, and a noise thereof is removed to a certain extent by the narrow band frequency filter 10 in a specific frequency band oscillated by the magnetostriction oscillator 2.

The signal from which noise is removed to a certain extent is amplified by the amplifier 11, and is converted into a digital signal by the A/D converter 12, and is demodulated into data by the microcomputer 13.

Incidentally, FIG. 3 omits the input portion of the data to be transmitted. The data to be transmitted may be comfortably given to the microcomputer 7 as digital signal.

The invention realizes acoustic transmission by using specific frequency as carrier. The center frequency of the narrow band frequency filter 10 is determined in accordance with this specific frequency band.

The specific frequency is classified, for example, into a frequency band hardly attenuating the sound wave (pass band) and a frequency band attenuating highly (stop band) in acoustic transmission of tube body or the like, according to Drumheller in "Acoustical Property of Drill Strings," a paper printed in The Journal of the Acoustical Society of America (1988). Therefore, the specific frequency must be a frequency in the pass band. The frequency of the pass band is determined by the tube body being used.

While the sound wave at specific frequency generated by the magnetostriction oscillator 2 is sensed by the vibration sensor 3, noises at various frequencies are sensed at the same time. If directly amplified by the amplifier 11 without passing through the narrow band filter 10, the noise may be too large, and the output range is saturated, so that the sound wave signal at required specific frequency may not be picked up. Accordingly, there is required the high performance narrow band frequency filter 10 of high performance capable of extracting only the signal of a specific frequency band before amplifying the sound wave signal.

In environments of poor S/N ratio, generation of sound wave as strong as possible is required, and when the transmission distance of the transmitting medium 1 is long, the sound wave reaching distance is limited by attenuation, and hence a stronger sound wave must be generated.

Figure 5:
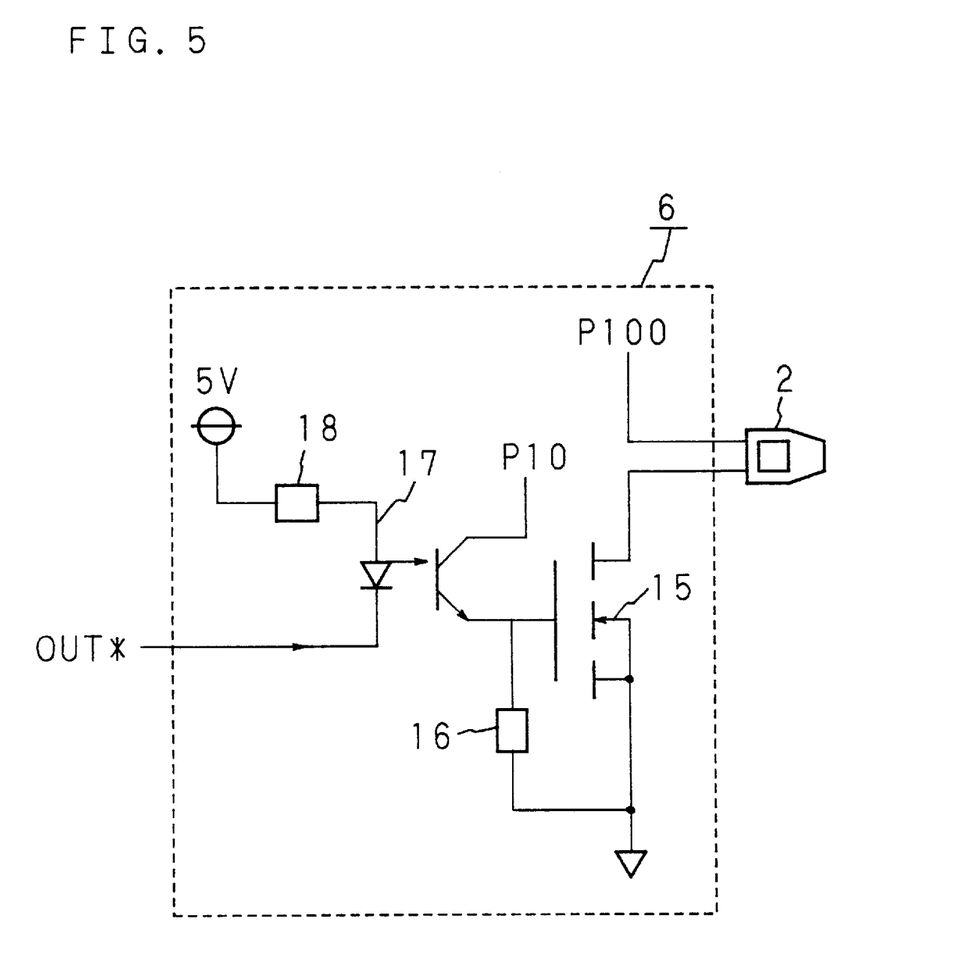
FIG. 5 is a diagram showing a circuit example of magnetostriction oscillator driver in FIG. 3.

For reference, how to generate a strong vibration by using the magnetostriction oscillator 2 is explained by referring to FIG. 5 which shows the detail of the driver 6 in FIG. 3.

The output terminal of the microcomputer 7 is connected to a photo coupler 17 connected to a power source of 5 V through a resistance 18. The photo coupler 17 is connected to the gate of an N-channel FET (field effect transistor) 15 connected between one terminal of the magnetostriction oscillator 2 and the ground, and a resistance 16 grounded. The N-channel FET 15 turns on and off the large current to flow into the magnetostriction oscillator 2.

OUT* is an output signal from the microcomputer 7, and when it is L, a current flows in the diode side of the photo coupler 17 to turn on the transistor, and a current flows in the resistance 16 and the gate input of the FET 15 becomes H, thereby turning on the FET 15, and thereby a large current flows in the magnetostriction oscillator 2, which generates a mechanic distortion.

When OUT* is H, the current does not flow in the diode side of the photo coupler 17, the transistor is turned off, the current does not flow in the resistance 16, the gate input of the FET 15 becomes L, the FET 15 is turned off, the current is not applied to the magnetostriction oscillator 2, and mechanical distortion is eliminated, thereby returning to the initial state.

That is, by changing OUT* between L and H, mechanical vibrations can be caused in the magnetostriction oscillator 2.

By using a ferriferous magnetostrictive material distorting by about 50 $\mu$m per unit length, a magnetostriction oscillator 2 of 0.2 m in length is fabricated, one end is fixed, and amount of vibration obtained at the other end is calculated. Supposing the displacement of the other end to be x, if vibrated at angular velocity $\omega$ by applying a current so as to distort to the full limit of distortion, it is approximated in the formula $x=0.2$ m$\times$(50 $\mu$m/m)$\times \sin \omega t$.

Since the vibration is detected as acceleration, the maximum value $\alpha$ of the vibration acceleration is $\alpha=0.2$ m$\times$(50 $\mu$m/m)$\times\omega^2$.

If vibrating at 3 kHz, vibration of $\alpha=3550$ m/S$^2$=360 G(1 G=9.8 m/S$^2$)

is generated.

The magnetostriction oscillator 2 can generate further stronger vibrations in the following manner.

The magnetostriction oscillator 2 is fabricated by adjusting its natural frequency to the above specific frequency. This is realized by adjusting the length, thickness and width of the magnetostriction oscillator 2.

The period of the current applied to the magnetostriction oscillator 2 is set at an integer multiple of the specific frequency. That is, by making good use of the mechanical resonance of the magnetostriction oscillator 2, a distortion more than the original distortion of the magnetostriction oscillator 2 is generated, and a far larger vibration can be generated.

Thus, by improving the design of the magnetostriction oscillator 2 and circuit of the driver 6, a strong vibration at specific frequency can be generated.

Figure 6A:
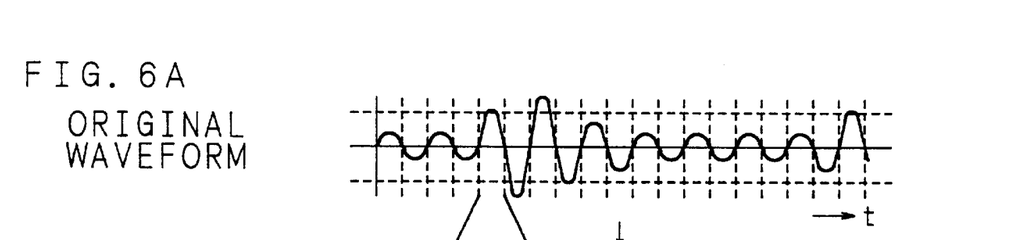
FIGS. 6A~6D are diagrams for explaining transformation of acoustic waveform in the demodulating apparatus of the invention.
Figure 6B:
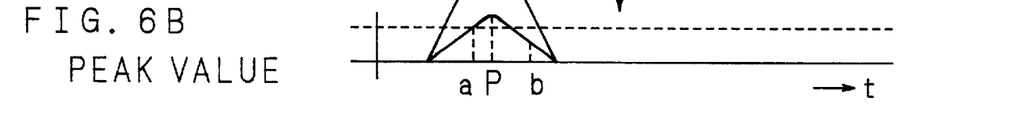
Figure 6C:
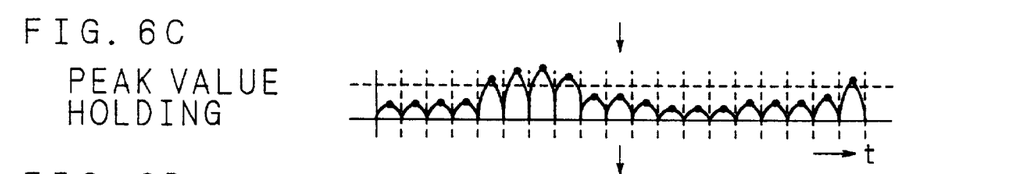

A demodulating method from acoustic signal to digital signal in the microcomputer 13 in the demodulating circuit 5 or the like is described below by referring to FIG. 6 which is a waveform explanatory diagram and FIG. 7 which is a flowchart showing the processing procedure.

In FIG. 6, an original waveform is an analog signal which is transmitted through the transmitting medium 1, detected by the vibration sensor 3, is passed through the buffer 9 and the narrow band frequency filter 10, and is amplified by the amplifier 11. To demodulate the analog signal into data by the microcomputer 13, first the crest value of each wave (hereinafter called peak value) of the carrier amplitude is determined.

To calculate the peak value, first the A/D converted value at arbitrary point is read and obtained as a. Next, the A/D converted value at a point shifted in phase by 90 degrees from this arbitrary point is read and obtained as b (step S52). To shift the phase by 90 degrees, using the specific frequency generated by the magnetostriction oscillator 2, it is realized by calculating the time t corresponding to 90 degrees. That is, the period of the input original waveform is determined by 1000 (msec)/frequency (Hz)

per wave. Since one wave is 360 degrees, the time t corresponding to 90 degrees is determined by dividing the value of the period obtained in the above formula by 4 (step S51).

Since the input wave may be regarded as sine wave, the wave peak value p is determined as $P=(a^2+b^2)^{1/2}$ This formula is, when $|a|\geq|b|$, approximated as $P=a+0.42(b^2/a)$ (1)

so that the peak value can be determined relatively easily (step S53). This is called the specified formula.

Incidentally, as a result of sampling of a and b, if $|a|<|b|$, the values of a and b may be exchanged. Besides, since demodulation is easier when all peak values are positive, as the values of a and b, absolute values may be used when calculating.

This calculation is operated by the microcomputer 13, but other operation circuit may be used exclusively. This is called a first operation circuit. The peak value of input wave is held as shown in FIG. 6C (it is not necessary to actually store the peak value in memory) and the demodulated waveform in the microcomputer 13 is obtained as shown in FIG. 6D (step S54).

Thus, according to the invention, as compared with the prior art which required sampling of more than 10 pieces per wave in order to obtain the peak value of waveform, only two samples are needed per wave and high speed CPU is not needed.

Figure 6D:
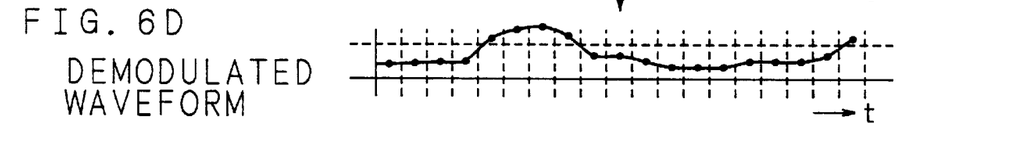
Figure 7:
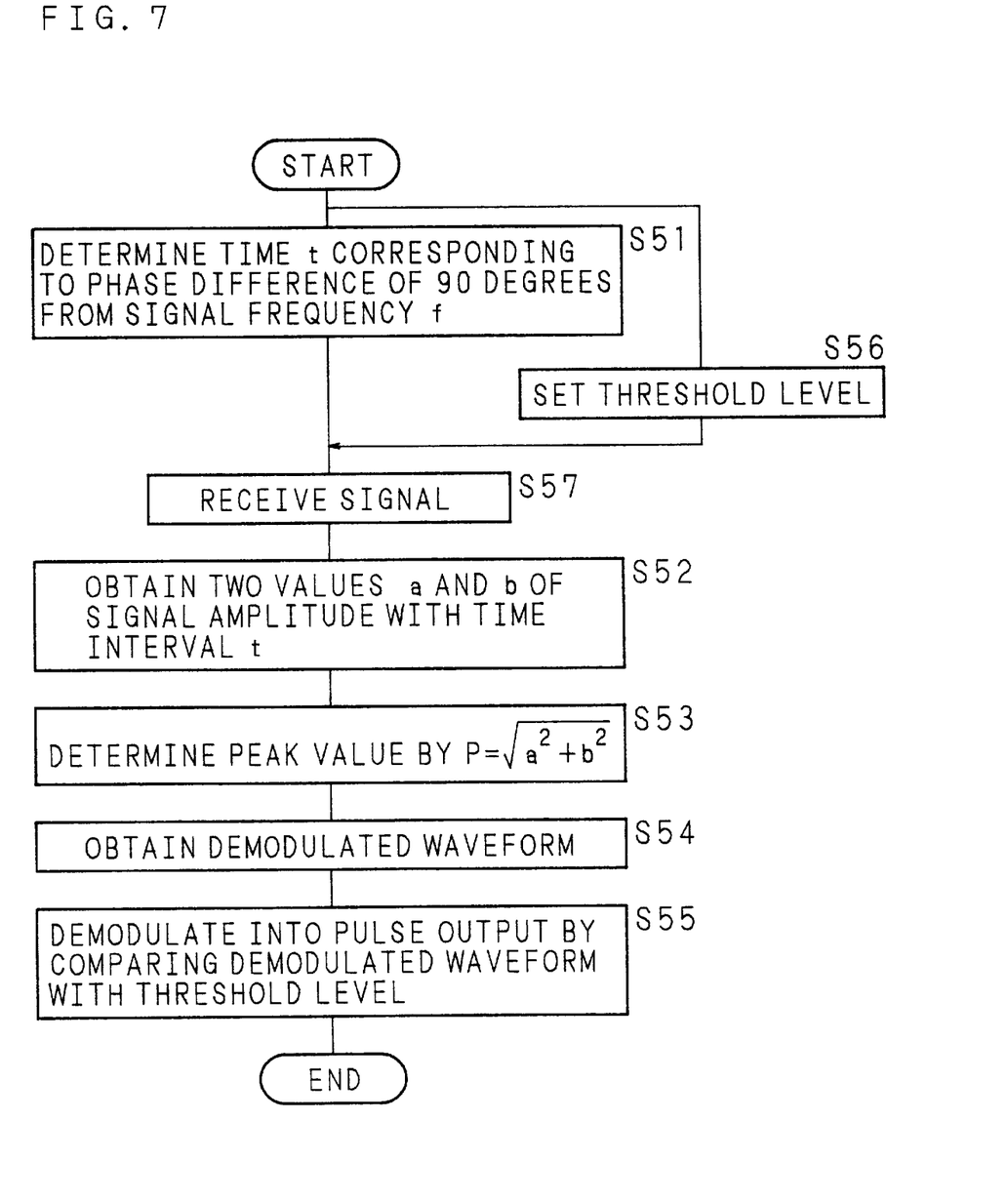
FIG.7 is a flowchart for explaining waveform transform processing in FIGS. 6A~6D.

The demodulated waveform in FIG. 6D is divided into noise and signal by the boundary line (hereinafter called threshold) of noise and data manually set preliminarily by threshold level setting device (step S56). That is, the held peak value exceeding the threshold is judged as data of level 1, and the value below the threshold as noise (data without signal) (step S55). Such circuit can be fabricated by using hardware circuit element or microcomputer 13.

Meanwhile, noise having a level exceeding the threshold level can be distinguished from the data in the following condition.

a) The bit interval (time) of the data by oscillation baud rate by the magnetostriction oscillator 2 is checked.

b) When judging data, data is distinguished by the number of peak values (more than a specific value and less than a specific value) exceeding the threshold in the time width corresponding to the specific frequency.

c) The moving average is calculated from the obtained peak value.

Thus, by composing the magnetostriction oscillator 2 capable of generating such powerful vibration by using the driver unit 4 having the driver 6 for generating specific frequency, and the demodulating circuit 5 for calculating the peak value of the waveform of signal of known frequency by the narrow band frequency filter 10 and the microcomputer 13, the frequency component outside the specific frequency band (noise) can be easily removed relatively, so that acoustic transmission in environments of poor S/N ratio is realized.

Embodiment 2

Figure 8:
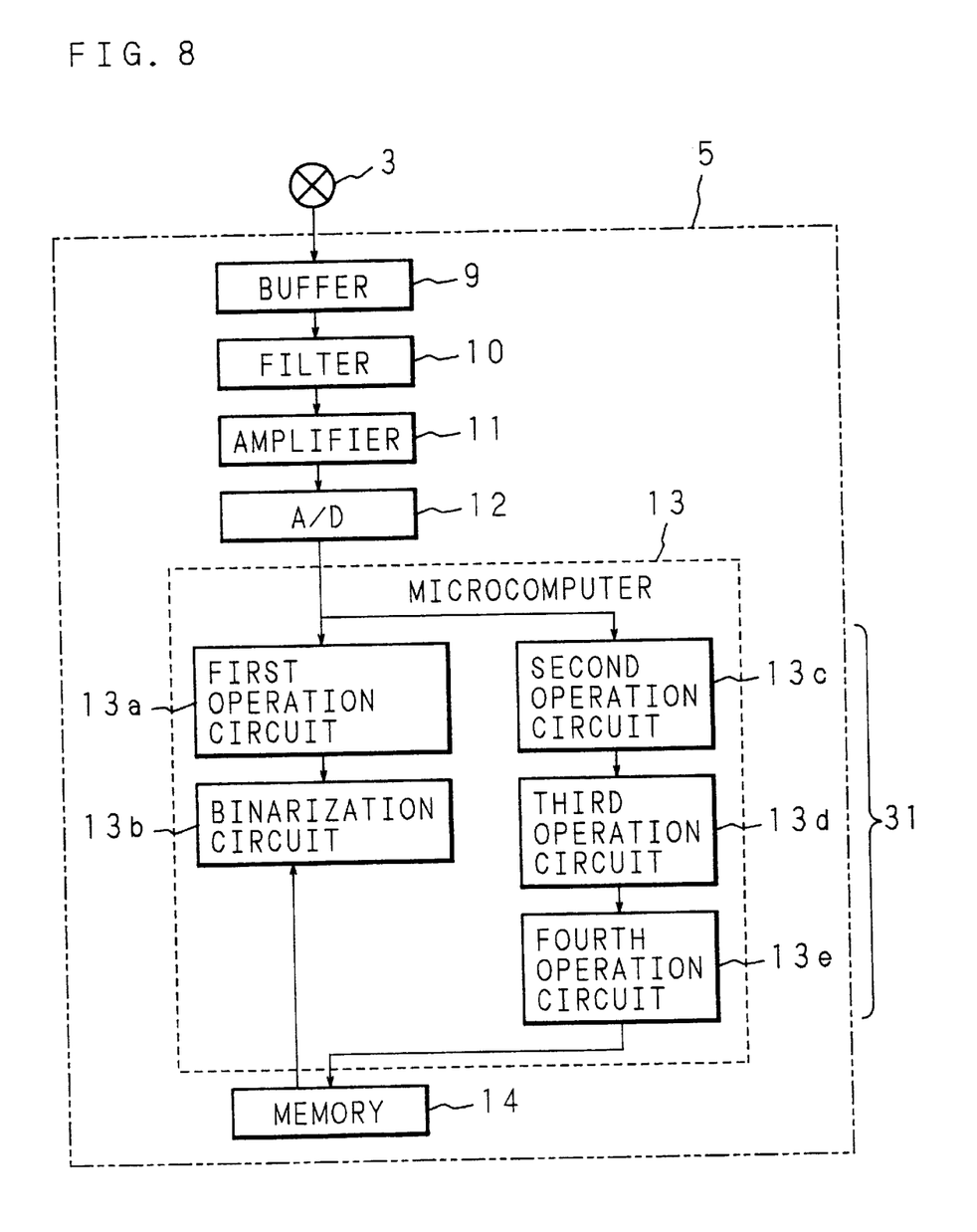
FIG. 8 is a block diagram of a demodulating apparatus in embodiment 2.
Figure 9:
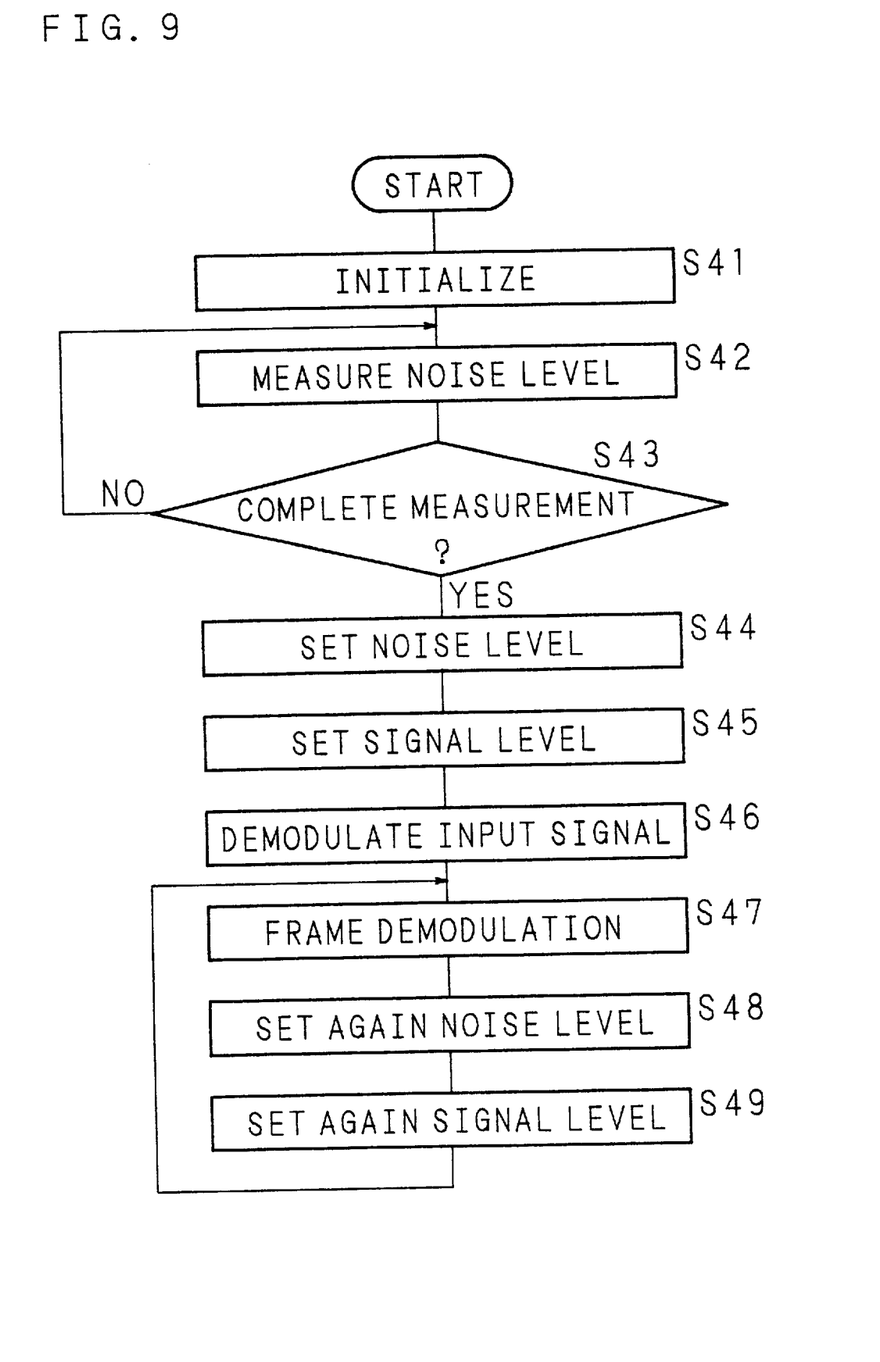
FIG. 9 is a flowchart for explaining the operation of the demodulating apparatus in FIG. 8.

Another embodiment of the invention is described by referring to FIG. 8 and FIG. 9. FIG. 8 is a block diagram of a demodulating circuit 5 according to embodiment 2, and FIG. 9 is a flowchart of program operated by a microcomputer 13 in the demodulating circuit 5. First, the microcomputer 13 and program internal variables are initialized (step S41), the noise level is measured in a preset time (step S42), completion of measuring time of the noise level measurement (step S42) is judged (step S43), the noise level of transmission environment is set (step S44) from the average of the input level of the noise measured in the noise level measurement (step S42), a signal level is set (step S45) which is calculated by using a predetermined formula on the basis of the noise level set in the noise level setting (step S44), and the actual input signal is bit-demodulated on the basis of the set noise level and the signal level (step S46).

Frame demodulation process is performed (step S47) for frame-demodulating the actual input signal on the basis of the set noise level and the set signal level, the noise level is calculated again by the processing result of frame demodulation (step S47), and the noise level is set again (step S48), and the signal level is set again (step S49) by the result of frame demodulation (step S47).

Each process is described in detail below. The noise level measurement (step S42) is preliminarily determined to be performed for how many seconds after turning on the power source (for example, 30 seconds), and oscillation from the oscillator 2 is banned in this period. In this state, by the input processing of the waveform explained in FIG. 6B, the noise peak value is obtained, and the average thereof is calculated. What is responsible for this operation is called a second operation circuit 13c. It is judged that this average is the noise level in the environment to perform acoustic transmission in from now on (noise level setting step S55). Once the noise level is set, a provisional signal level can be defined from the definition formula (for example, signal level=noise level×2) of the signal level judged from the transmission environments or the like at signal level setting step S45. What is responsible for this operation is called a third operation circuit 13d.

When the noise level and the signal level are defined, the threshold of demodulation process explained in FIG. 6D can be calculated (for example, threshold=(noise level+signal level)/2). What is responsible for this operation is called a fourth operation circuit 13e.

The threshold is the boundary line for separating the signal level and the noise level. In acoustic transmission, since the S/N ratio varies depending on the environments, the threshold must be set in each transmission environment, and it is not only intricate but it also leads to lowering of reliability of the result of demodulation.

Since the threshold can be set automatically by the method explained in embodiment 2, the threshold setting process in embodiment 1 can be omitted, and the threshold suited to the transmission environment is obtained easily. Moreover, it is possible to cope flexibly with changes of transmission environments, the demodulation system can be built easily, and the reliability of result of demodulation is enhanced.

In embodiment 2, along with changes in transmission environments, it may be possible that the input signal be lowered, and in such a case, a mechanism for controlling the amplification factor in the amplifier 11 may be incorporated.

As the invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

We claim:

1. A demodulating circuit of acoustic signal detected by a vibration sensor, the acoustic signal being emitted from an acoustic signal transmitter in a waveform modulated by pulse signal, and propagated through a transmitting medium, comprising:

a first operation circuit for calculating an amplitude peak value by a predetermined formula from two values of an amplitude in a time interval corresponding to a phase difference of 90 degrees of said pulse signal;

a threshold level setting device for setting a threshold level for said amplitude peak value; and a binarization circuit for demodulating said amplitude peak value by binarization on the basis of said threshold level.

2. The demodulating circuit of acoustic signal according to claim 1, wherein said threshold level setting device has manually setting means.

3. The demodulating circuit of acoustic signal according to claim 1, wherein said threshold level setting device includes:

a second operation circuit for automatically calculating the average of peak values of output of the vibration sensor in a state not transmitting the acoustic signal by said acoustic signal transmitter;

a third operation circuit for automatically setting the signal level by a formula predetermined on the basis of the obtained average; and a fourth operation circuit for automatically calculating the threshold level from said average and said signal level.

4. A demodulating apparatus of acoustic signal detected by a vibration sensor, the acoustic signal being emitted from an acoustic signal transmitter in a waveform modulated by pulse signal, propagated through a transmitting medium, and then detected by a vibration sensor, comprising:

a vibration sensor installed in said transmitting medium for converting said acoustic signal into an electric signal and outputting;

a first operation circuit for calculating an amplitude peak value by a specific formula from two values of an amplitude in a time interval corresponding to a phase difference of 90 degrees of said pulse signal;

a threshold level setting device for setting a threshold level for said amplitude peak value; and a binarization circuit for demodulating said amplitude peak value by binarization on the basis of said threshold level.

5. The demodulating apparatus of acoustic signal according to claim 4, wherein said threshold level setting device has manually setting means.

6. The demodulating apparatus of acoustic signal according to claim 4, wherein said threshold level setting device includes:

a second operation circuit for automatically calculating the average of peak values of output of the vibration sensor in a state not transmitting the acoustic signal by said acoustic signal transmitter;

a third operation circuit for automatically setting the signal level by a formula predetermined on the basis of the obtained average; and a fourth operation circuit for automatically calculating the threshold level from said average and said signal level.

7. A demodulating method of acoustic signal detected by a vibration sensor, the acoustic signal being emitted from an acoustic signal transmitter in a waveform modulated by pulse signal, and propagated through a transmitting medium, comprising the steps of:

calculating an amplitude peak value by a specific formula from two values of an amplitude in a time interval corresponding to a phase difference of 90 degrees of said pulse signal;

setting a threshold level for said amplitude peak value; and demodulating said amplitude peak value by binarization on the basis of said threshold level.

8. The demodulating method of acoustic signal according to claim 7, wherein said threshold level is set manually.

9. The demodulating method of acoustic signal according to claim 7, further comprising the steps of:

automatically calculating the average of peak values of output of the vibration sensor in a state not transmitting the acoustic signal by said acoustic signal transmitter;

automatically setting the signal level by a formula predetermined on the basis of the obtained average; and automatically calculating the threshold level from said average and said signal level.

10. The demodulating method of acoustic signal according to claim 7, further comprising the following steps to be executed prior to the steps of claim 7:

automatically calculating the average of peak values of output of the vibration sensor in a state not transmitting the acoustic signal by said acoustic signal transmitter;

automatically setting the signal level by a formula predetermined on the basis of the obtained average; and automatically calculating the threshold level from said average and said signal level.

11. A modulating/demodulating system, comprising:

an acoustic signal transmitter for transmitting a waveform modulated by a pulse signal through a transmitting medium;

a vibration sensor for converting said acoustic signal into an electric signal and outputting a pulse signal, the acoustic signal being emitted from said acoustic signal transmitter and propagated through a transmitting medium;

a first operation circuit for calculating an amplitude peak value by a specific formula from two values of an amplitude in a time interval corresponding to a phase different of 90 degrees of said pulse signal;

a threshold level setting device for setting a threshold level for said amplitude peak value; and a binarization circuit for demodulating said amplitude peak value by binarization on the basis of said threshold level.

12. The system according to claim 11, wherein said threshold level setting device has manually setting means.

13. The system according to claim 11, wherein said threshold level setting device includes:

a second operation circuit for automatically calculating the average of peak values of output of the vibration sensor in a state not transmitting the acoustic signal by said acoustic signal transmitter;

a third operation circuit for automatically setting the signal level by a formula predetermined on the basis of the obtained average; and a fourth operation circuit for automatically calculating the threshold level from said average and said signal level.

* * * * *